(12) United States Patent
Xu

(10) Patent No.: US 10,121,980 B2
(45) Date of Patent: Nov. 6, 2018

(54) THIN FILM TRANSISTOR ARRAY PANEL AND MANUFACTURING METHOD OF THE SAME

(71) Applicant: SHENZHEN CHINA STAR OPTOELECTRONICS TECHNOLOGY CO., LTD., Guangdong (CN)

(72) Inventor: Hongyuan Xu, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 186 days.

(21) Appl. No.: 15/113,581

(22) PCT Filed: Apr. 8, 2016

(86) PCT No.: PCT/CN2016/078765
§ 371 (c)(1),
(2) Date: Jul. 22, 2016

(87) PCT Pub. No.: WO2017/156810
PCT Pub. Date: Sep. 21, 2017

(65) Prior Publication Data
US 2017/0373261 A1    Dec. 28, 2017

(30) Foreign Application Priority Data
Mar. 17, 2016    (CN) .......................... 2016 1 0153933

(51) Int. Cl.
H01L 35/24 (2006.01)
H01L 51/05 (2006.01)
(Continued)

(52) U.S. Cl.
CPC .......... *H01L 51/0508* (2013.01); *H01L 27/12* (2013.01); *H01L 27/3262* (2013.01);
(Continued)

(58) Field of Classification Search
CPC ............. H01L 51/0508; H01L 51/0541; H01L 27/3262; H01L 2251/50; H01L 2251/53; H01L 2251/55
(Continued)

(56) References Cited

U.S. PATENT DOCUMENTS 7,646,443 B2    1/2010   Choi et al.
9,818,850 B2 *  11/2017  Yamazaki ......... H01L 29/66969
(Continued)

FOREIGN PATENT DOCUMENTS

CN     101013240 A    8/2007
CN     101093325 A    12/2007
(Continued)

*Primary Examiner* — Matthew E Warren
(74) *Attorney, Agent, or Firm* — Muncy, Geissler, Olds & Lowe, P.C.

(57) ABSTRACT

A thin film transistor array panel and a manufacturing method are disclosed herein. The thin film transistor array panel includes a data line, a first block of a source electrode, a third block of a drain electrode, and an electrode layer which are formed by a first metal layer disposed on a baseplate; a second block of the source electrode, a fourth block of the drain electrode are formed by a second metal layer which is disposed on the first metal layer. The first block and the second block overlap to combine integrally. The third block and the fourth block overlap to combine integrally. The present invention can decrease the electrical resistance of each of the source electrode and the drain electrode.

3 Claims, 9 Drawing Sheets

(51) Int. Cl.
  *H01L 27/12* (2006.01)
  *H01L 27/32* (2006.01)
(52) U.S. Cl.
  CPC .... *H01L 51/0541* (2013.01); *H01L 2251/308* (2013.01); *H01L 2251/53* (2013.01); *H01L 2251/55* (2013.01)
(58) Field of Classification Search
  USPC .......................................................... 257/40
  See application file for complete search history.

(56) References Cited

U.S. PATENT DOCUMENTS

| | | | |
|---|---|---|---|
| 2005/0179036 A1* | 8/2005 | Yamazaki | H01L 27/1292 257/66 |
| 2007/0120116 A1* | 5/2007 | Han | H01L 51/0541 257/40 |
| 2012/0018706 A1* | 1/2012 | Kagan | H01L 51/0558 257/40 |
| 2013/0228756 A1* | 9/2013 | Lee | H01L 51/52 257/40 |
| 2017/0148822 A1 | 5/2017 | Hu | |

FOREIGN PATENT DOCUMENTS

| | | |
|---|---|---|
| CN | 105280647 A | 1/2016 |
| CN | 105355634 A | 2/2016 |

\* cited by examiner

THIN FILM TRANSISTOR ARRAY PANEL AND MANUFACTURING METHOD OF THE SAME

BACKGROUND OF THE INVENTION

Field of Invention

The present invention relates to the field of display technology, and more particularly to a thin film transistor array panel and a manufacturing method of the same.

Description of Prior Art

Organic materials are generally applied as the semiconductor material to a traditional organic thin film transistor (OTFT). Au, Ag, or Indium Tin Oxide (ITO) with a high work function are generally chosen as the electrode material of the source and drain electrodes of the traditional OTFT, to match a highest occupied molecular orbital (HOMO) energy level of the organic semiconductor material within the OTFT, in order to decrease the hole-transfer barrier and the contact resistance.

In practice, the inventor has found that the prior art has at least the following issues:

Au and Ag are both precious metals, the material cost is very high, and Ag is easier to be oxidized by ions without a protective layer covering. The oxidation of Ag decreases the conductivity thereof.

The ITO has a lower cost and a high work function, however, its resistance is relatively high so it can only be the material of the source and drain electrodes, and is unable to be used as a wire for transportation of current.

To sum up, the manufacturing cost of the traditional OTFT is higher; hence, the manufacturing cost of the thin film transistor array panel applied with the traditional OTFT is higher accordingly.

Hence, it is needed to provide a new technical proposal, to solve the above technical issues.

SUMMARY OF THE INVENTION

An objective of the present invention is to provide a thin film transistor array panel and a manufacturing method of the same, which are able to decrease the manufacturing cost of the OTFT and the electrical resistance of each of the source electrode and the drain electrode of the OTFT at the same time.

In order to solve the above purpose, the technical proposal of the present invention is as follows:

A thin film transistor array panel, which comprises: a baseplate; a data line, which is formed by a first metal layer, the first metal layer is disposed on the baseplate; a thin film transistor, the thin film transistor comprises: a source electrode, which comprises a first block and a second block, the first block and the second block overlap to combine integrally, the first block is a portion of the first metal layer located in a first region, the second block is a portion of a second metal layer located in the first region, wherein the first region is a portion to which the source electrode corresponds, the second metal layer is disposed on the first metal layer, the source electrode connects with the data line; a drain electrode, which comprises a third block and a fourth block, the third block and the fourth block overlap to combine integrally the third block is a portion of the first metal layer located in a second region, the fourth block is a portion of a second metal layer located in the second region, wherein the second region is a portion to which the drain electrode corresponds, the second metal layer is disposed on the first metal layer; a semiconductor layer overlaps on the source electrode, the drain electrode, and a gap between the source electrode and the drain electrode; a gate electrode is over the semiconductor; an insulation layer overlaps on the data line and the semiconductor layer; a scanning line is disposed on the insulation layer, the scanning line connects with the gate electrode; a protection layer is disposed on the scanning line and the insulation layer; an electrode layer is formed by the first metal layer, the electrode layer connects with the drain electrode; the gate electrode is disposed on the insulation layer; the data line, the first block of the source electrode, the third block of the drain electrode, and the electrode layer are all formed by applying a first tone-mask process and a first etching process to the first metal layer; the second block of the source electrode and the fourth block of the drain electrode are both formed by applying a second etching process to the second metal layer which has been processed by the first tone-mask process and the first etching process; the semiconductor layer is formed by disposing a semiconductor material on at least one portion of the source electrode, at least one portion of the drain electrode, and the gap, then applying a second tone-mask process to the semiconductor material.

In the thin film transistor array panel, the data line, the first block of the source electrode, the third block of the drain electrode, and the electrode layer are all formed by applying the first tone-mask process to a photoresist layer which overlaps on the second metal layer, to pattern the photoresist layer, then etching the second metal layer and the first metal layer respectively by using a second metal etching solution and a first metal etching solution; the second block of the source electrode and the fourth block of the drain electrode are both formed by performing a gray process on the photoresist layer which has been processed by the first tone-mask process, then etching the second metal layer by using the second metal etching solution and removing the photoresist layer which is disposed on the second metal layer.

In the thin film transistor array panel, the gate electrode and the scanning line both are formed by disposing a third metal layer on the insulation layer, then applying a third tone-mask process to the third metal layer.

A thin film transistor array panel, which comprises: a baseplate; a data line, which is formed by a first metal layer, the first metal layer is disposed on the baseplate; a thin film transistor, the thin film transistor comprises: a source electrode, which comprises a first block and a second block, the first block and the second block overlap to combine integrally the first block is a portion of the first metal layer located in a first, region, the second block is a portion of a second metal layer located in the first region, wherein the first region is a portion to which the source electrode corresponds, the second metal layer is disposed on the first metal layer, the source electrode connects with the data line; a drain electrode, which comprises a third block and a fourth block, the third block and the fourth block overlap to combine integrally the third block is a portion of the first metal layer located in a second region, the fourth block is a portion of a second metal layer located in the second region, wherein the second region is a portion to which the drain electrode corresponds, the second metal layer is disposed on the first metal layer; a gate electrode is over the semiconductor; a semiconductor layer overlaps on the source electrode, the drain electrode, and a gap between the source electrode and the drain electrode; a gate electrode; an insulation layer overlaps on the data line and the semiconductor layer; a scanning line is disposed on the insulation layer, the scanning line connecting with the gate electrode; a protection layer is disposed on the scanning line and the insulation layer; an electrode layer is formed by the first metal layer, the electrode layer connecting with the drain electrode; the gate electrode is disposed on the insulation layer.

In the thin film transistor array panel, the data line, the first block of the source electrode, the third block of the drain electrode, and the electrode layer are all formed by applying a first tone-mask process and a first etching process to the first metal layer; the second block of the source electrode and the fourth block of the drain electrode are both formed by applying a second etching process to the second metal layer which has been processed by the first tone-mask process and the first etching process.

In the thin film transistor array panel, the data line, the first block of the source electrode, the third block of the drain electrode, and the electrode layer are all formed by applying the first tone-mask process to a photoresist layer which overlaps on the second metal layer, to pattern the photoresist layer, then etching the second metal layer and the first metal layer respectively by using a second metal etching solution and a first metal etching solution; the second block of the source electrode and the fourth block of the drain electrode are both formed by performing a gray process to the photoresist layer which has been processed by the first tone-mask process, then etching the second metal layer by using the second metal etching solution and removing the photoresist layer which is disposed on the second metal layer.

In the thin film transistor array panel, the semiconductor layer is formed by disposing a semiconductor material on at least one portion of the source electrode, at least one portion of the drain electrode, and the gap, then applying a second tone-mask process to the semiconductor material.

In the thin film transistor array panel, the gate electrode and the scanning line both are formed by disposing a third metal layer on the insulation layer, then applying a third tone-mask process to the third metal layer.

In the thin film transistor array panel, the gate electrode and the scanning line both are formed by disposing a third metal layer on the insulation layer, then applying a third tone-mask process to the third metal layer.

In the thin film transistor array panel, the semiconductor layer is an organic semiconductor layer.

In the thin film transistor array panel, the semiconductor material is disposed on the at least one portion of the source electrode, the at least one portion of the drain electrode, and the gap by any one of spin-coating, slot-die, and ink-jet printing.

In the thin film transistor array panel, a portion of the first metal layer to which the electrode layer corresponds carries an organic lighting material layer and a positive electrode layer, a portion of the protection layer and/or the insulation layer corresponding to the electrode layer of the thin film transistor array panel is moved away to expose the portion of the first metal layer to which the electrode layer corresponds.

A thin film transistor array panel manufacturing method according to above thin film transistor array panel, the manufacturing method comprises: A. the first metal layer and the second metal layer are disposed on the baseplate; B. the data line, the first block of the source electrode, the third block of the drain electrode, and the electrode layer are formed by the first metal layer, and the second block of the source electrode and the fourth block of the drain electrode are formed by the second metal layer, wherein the second block and the first block overlap to combine integrally the fourth block and the third block overlap to combine integrally, the source electrode connects with the data line, the drain electrode connects with the electrode layer; C. the semiconductor layer is disposed on the source electrode, the drain electrode, and the gap between the source electrode and the drain electrode; D. the insulation layer is disposed on the data line and the semiconductor layer; E. the gate electrode, the scanning line, and the protection layer are disposed on the insulation layer, wherein the scanning line connects with the gate electrode.

In the thin film transistor array panel manufacturing method, the step B. comprises: b1. a first tone-mask process and a first etching process are applied to the first metal layer and the second metal layer, to make the first metal layer form the data line, the first block of the source electrode, the third block of the drain electrode, and the electrode layer; b2. a second etching process is applied to the second metal layer which has been processed by the first tone-mask process and the first etching process, to make the second metal layer form the second block of the source electrode and the fourth block of the drain electrode.

In the thin film transistor array panel manufacturing method, before the step b1, the step B further comprises: b3. the first tone-mask process is applied to a photoresist layer which overlaps on the second metal layer, to pattern the photoresist layer; the step b1 is: the second metal layer and the first metal layer respectively are etched by using a second metal etching solution and a first metal etching solution, to make the first metal layer form the data line, the first block of the source electrode, the third block of the drain electrode, and the electrode layer; after the step b1 and before the step b2, the step B further comprises: b4. a gray process is performed on the photoresist layer which has been processed by the first tone-mask process; the step b2 is: the second metal layer is etched by using the second metal etching solution, to make the second metal layer form the second block of the source electrode and the fourth block of the drain electrode; after the step b2, the step B further comprises: b5. the photoresist layer which is disposed on the second metal layer is removed.

In the thin film transistor array panel manufacturing method, the step C further comprises: c1. a semiconductor material is disposed on at least one portion of the source electrode, at least one portion of the drain electrode, and the gap; c2. a second tone-mask process is applied to the semiconductor material, to form the semiconductor layer.

In the thin film transistor array panel manufacturing method, the step c1 is: the semiconductor material is disposed on the at least one portion of the source electrode, the at least one portion of the drain electrode, and the gap by any one of spin-coating, slot-die, and ink-jet printing.

In the thin film transistor array panel manufacturing method, the step E comprises: e1. a third metal layer is disposed on the insulation layer; e2. a third tone-mask process is applied to the third metal layer, to form the gate electrode and the scanning line; e3. the protection layer is disposed on the insulation layer, the scanning line and the gate electrode.

In the thin film transistor array panel manufacturing method, the semiconductor layer is an organic semiconductor layer.

In the thin film transistor array panel manufacturing method, the method further comprises the following step after the step E: F. a fourth tone-mask process is applied to the protection layer and/or the insulation layer, a portion of the protection layer and/or the insulation layer to which the electrode layer of the thin film transistor array panel corresponds is removed, to expose the portion of the first metal layer to which the electrode layer corresponds.

In the thin film transistor array panel manufacturing method, the method further comprises the following step after the step F: G an organic lighting material layer is evaporated on the portion of the first metal layer to which the electrode layer corresponds, and forming a positive electrode layer on the organic lighting material layer.

Compared with the conventional art, the present invention decreases the manufacturing cost of the OTFT and the electrical resistance of each of the source electrode and the drain electrode of the OTFT at the same time.

To make the above-described present invention more fully comprehensible, with preferred embodiments accompanied with drawings, the detail descriptions are as below.

DETAILED DESCRIPTION OF THE PREFERRED EMBODIMENTS

The term "an embodiment" used in this specification means instance, an example, or illustration. In addition, the use of "a" in this specification and the appended claims, in general, can be interpreted as "one or more", unless specified otherwise or a singular form is clear from the context.

The thin film transistor array panel of the present invention can be applied in a display panel, and the display panel can be, for example, TFT-LCD (thin film transistor liquid crystal display), or OLED (organic light emitting diode).

The thin film transistor array panel of the present invention can be used as the array panel of the thin film transistor liquid crystal display panel. In this situation, the electrode layer of the thin film transistor array panel can be a bar-shaped electrode. The thin film transistor array panel is used to build up the thin film transistor liquid crystal display panel with a liquid crystal layer and a color filter array panel.

The thin film transistor array panel of the present invention can be used as the array panel of the organic light emitting diode display panel. In this situation, the electrode layer of the thin film transistor array panel can be a negative electrode layer. The thin film transistor array panel is used to build up the organic light emitting diode display panel with an organic lighting material layer and a positive electrode layer.

Referring to FIGS. 7-14, the thin film transistor array panel of the present invention comprises a baseplate 101, a data line 701, a thin film transistor, an insulation layer 901, a scanning line 1401, a protection layer 1101, and an electrode layer 704.

Figure 1:
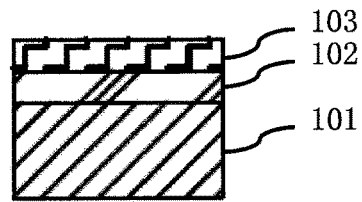
FIGS. 1-6 are illustrative drawings of steps for forming a data line, a source electrode, a drain electrode, and an electrode layer of a thin film transistor array panel in accordance with the present invention.

Also referring to FIG. 1, the data line 701 is formed by a first metal layer 102. The first metal layer 102 is disposed on the baseplate 101. The first metal to which the first metal layer 102 corresponds can be such as Al, Cu, Mo, and Ti.

The thin film transistor comprises a source electrode, a drain electrode, and a semiconductor layer 801, and a gate electrode 1001. The source electrode comprises a first block and a second block 702, the first block and the second block 702 overlap to combine as an integral. The first block is a portion of the first metal layer 102 located in a first region, the second block 702 is a portion of a second metal layer 103 located in the first region. The first region is a portion to which the source electrode corresponds, the second metal layer 103 is disposed on the first metal layer 102, the second metal layer 103 is disposed on the first metal layer 102 by a disposing method, and the source electrode connects with the data line 701. The second metal to which second metal layer 103 corresponds can be, for example, ITO (indium tin oxide). The drain electrode comprises a third block and a fourth block 703, the third block and the fourth block 703 overlap to combine integrally. The third block is a portion of the first metal layer 102 located in a second region, the fourth block 703 is a portion of a second metal layer 103 located in the second region. The second region is a portion to which the drain electrode corresponds. The gate electrode 1001 is disposed on the insulation layer 901. The semiconductor layer 801 overlaps on the source electrode, the drain electrode, and a gap between the source electrode and the drain electrode.

The insulation layer 901 overlaps on the data line 701 and the semiconductor layer 801. The scanning line 1401 is disposed on the insulation layer 901. The scanning line 1401 connects with the gate electrode 1001. The electrode layer 704 is formed by the first metal layer 102. The electrode layer 704 connects with the drain electrode.

In the thin film transistor array panel of the present invention, the source electrode and the drain electrode both are double-layer structures formed by the first metal layer 102 and the second metal layer 103.

The thin film transistor array panel of the present invention can be, for example, a flexible thin film transistor array panel. In this situation, the baseplate 101 can be a plastic baseplate, the semiconductor layer 801 can be an organic semiconductor layer, and the insulation layer 901 can be an organic insulation layer.

In the thin film transistor array panel of the present invention, the data line 701, the first block of the source electrode, the third block of the drain electrode, and the electrode layer 704 are all formed by applying a first tone-mask process and a first etching process to the first metal layer 102.

The second block 702 of the source electrode and the fourth block 703 of the drain electrode are both formed by applying a second etching process to the second metal layer 103 which has been processed by the first tone-mask process and the first etching process.

Figure 2:
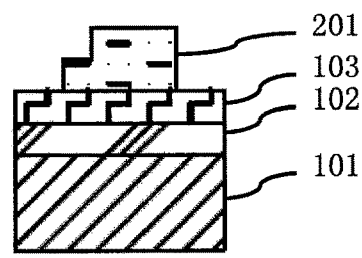
Figure 3:
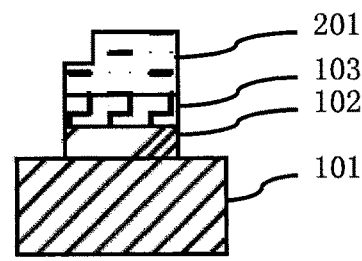
Figure 4:
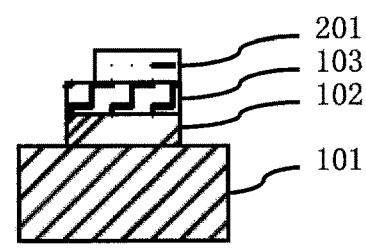
Figure 5:
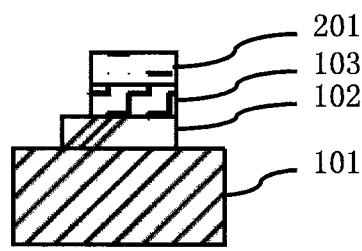
Figure 6:
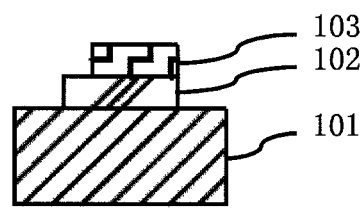
Figure 7:
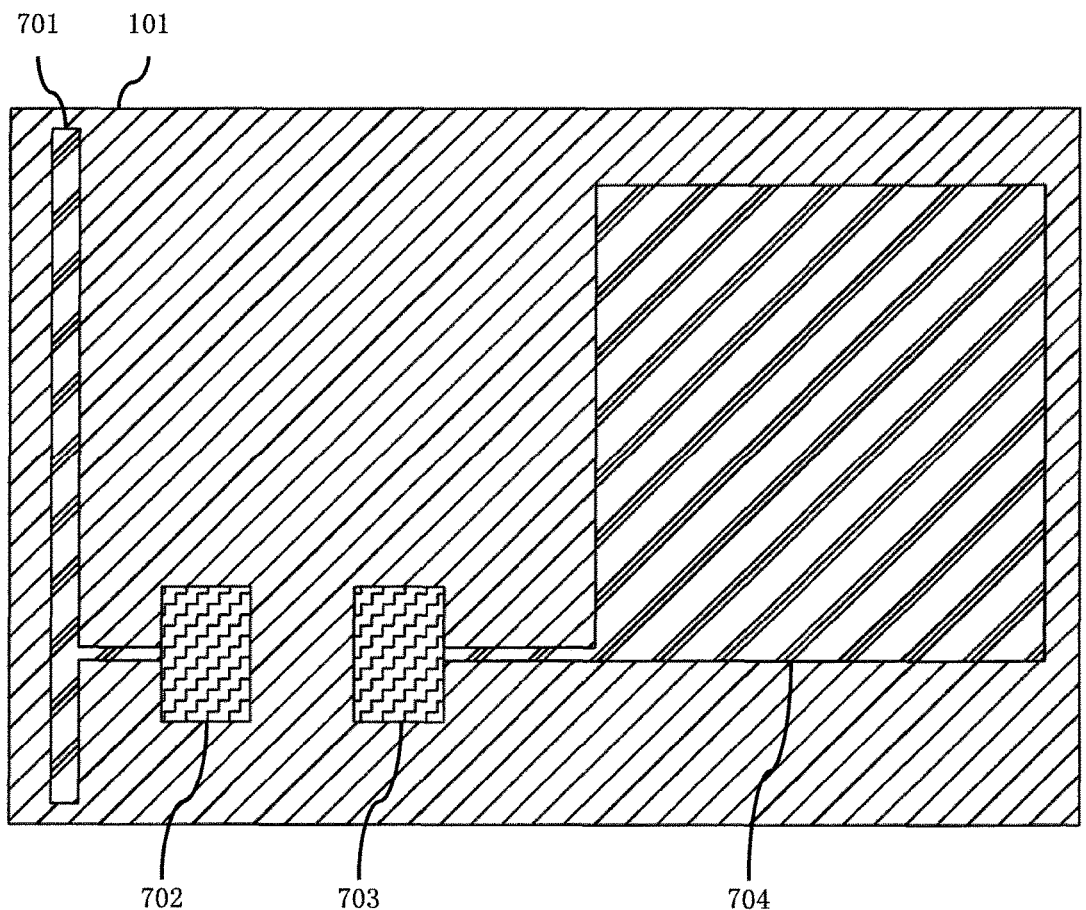
FIG. 7 is a top-view illustrative drawing after the data line, the source electrode, the drain electrode, and the electrode layer of the thin film transistor array panel of the present invention are formed.
Figure 8:
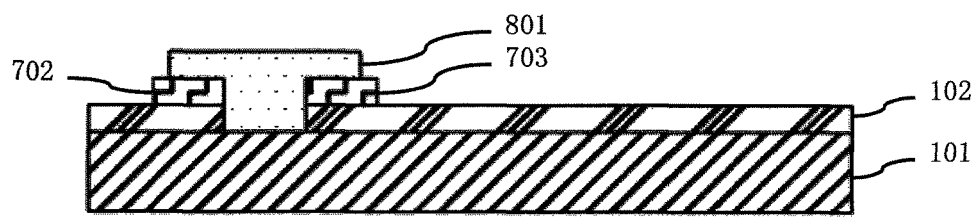
FIGS. 8-13 are illustrative drawings of steps for forming other elements after the data line, the source electrode, the drain electrode, and the electrode layer of the thin film transistor array panel of the present invention are formed.
Figure 9:
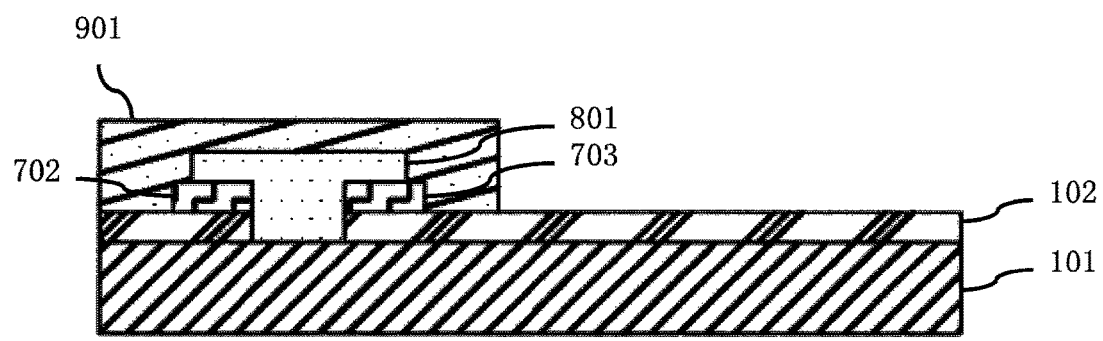
Figure 10:
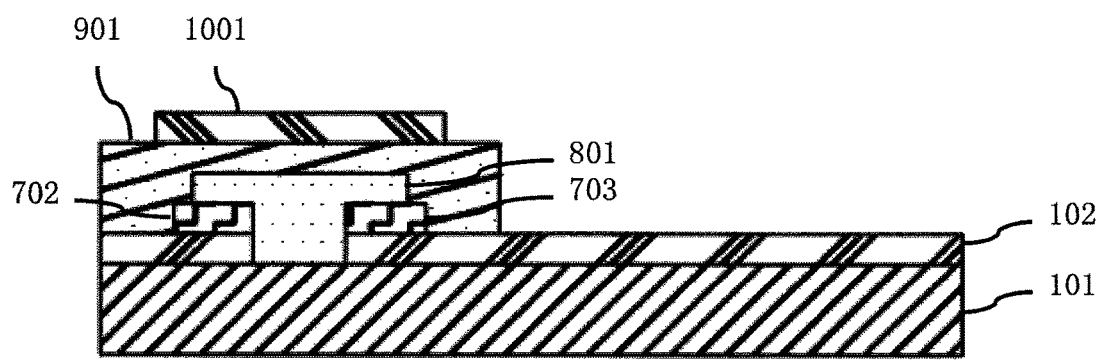
Figure 11:
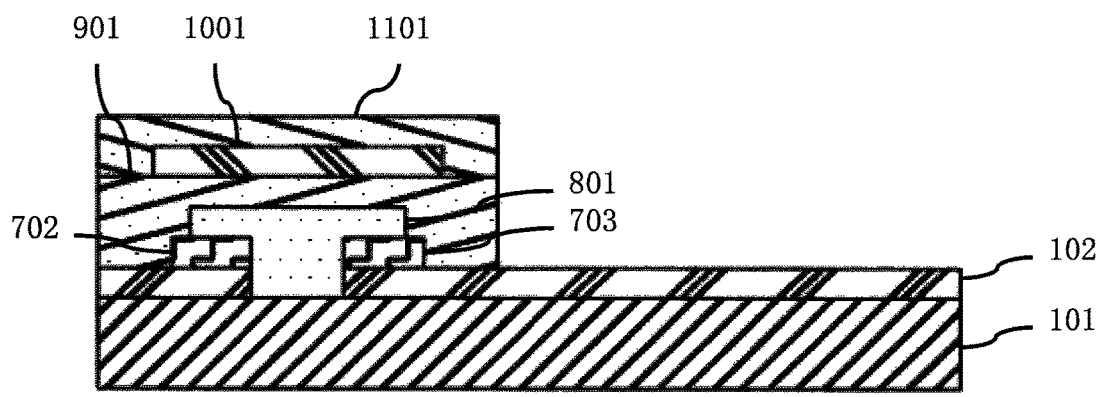
Figure 12:
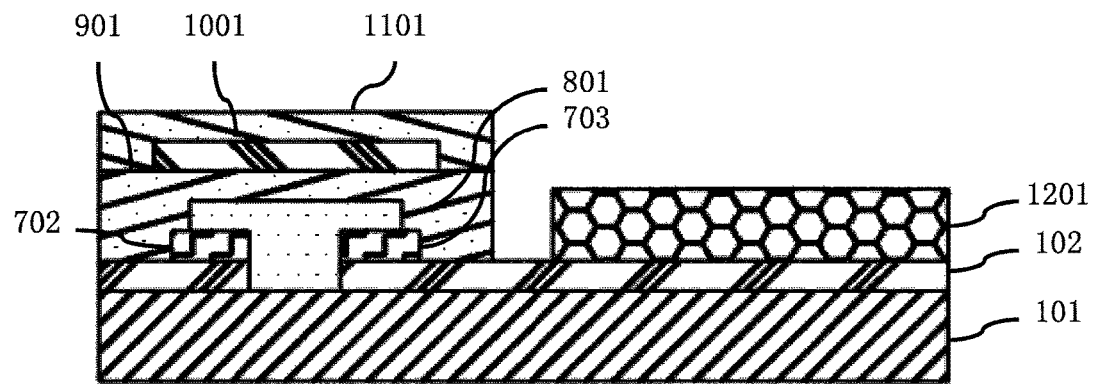
Figure 13:
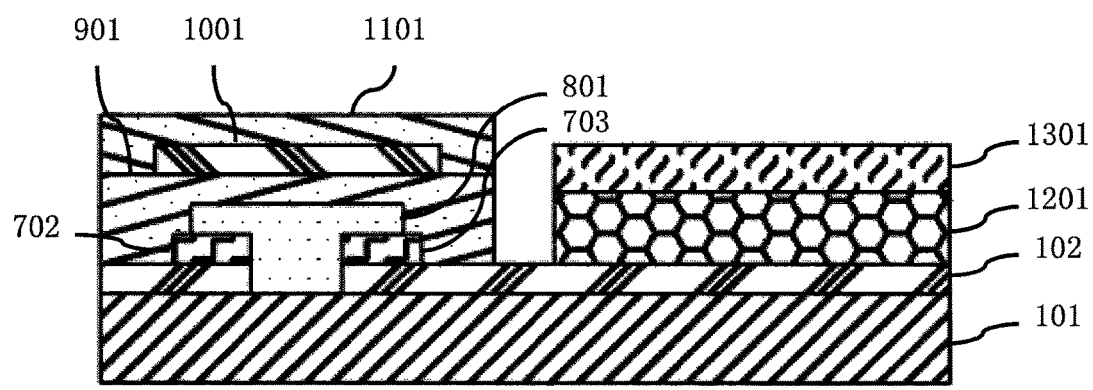
Figure 14:
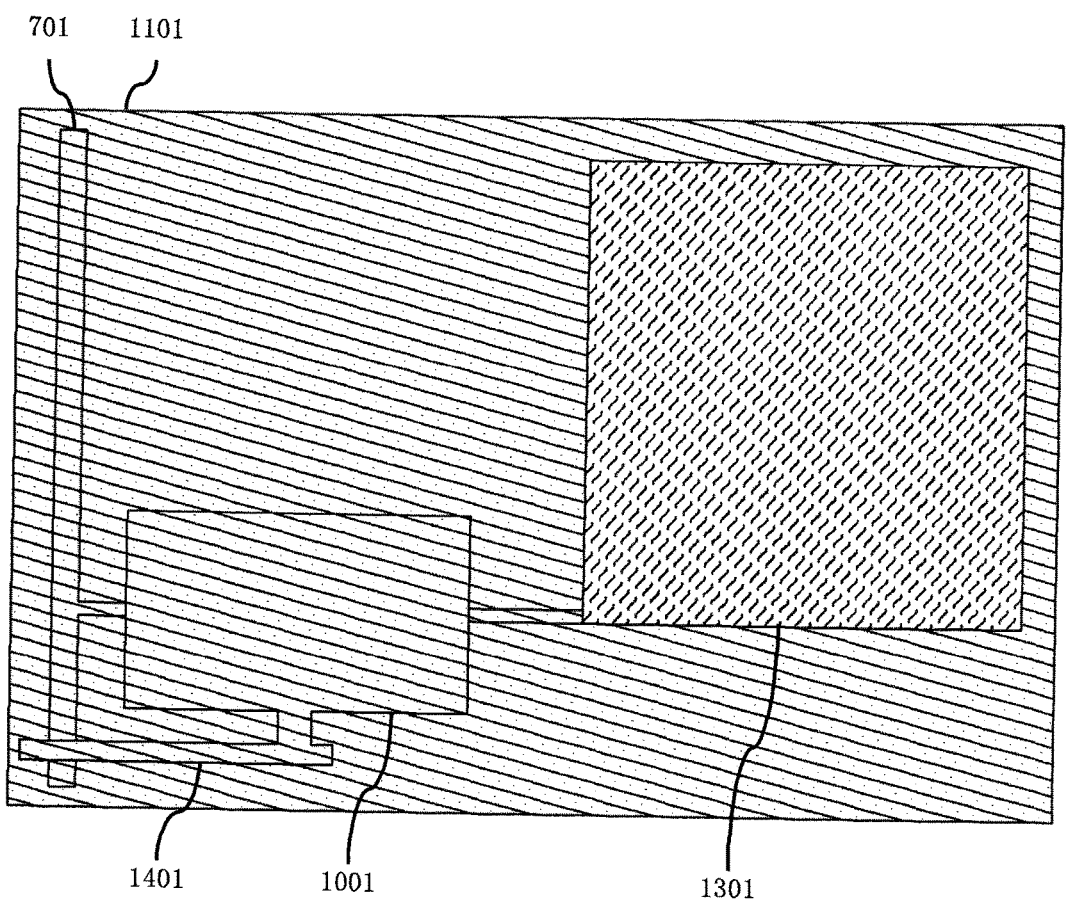
FIG. 14 is a top-view illustrative drawing after an organic lighting material layer and a positive electrode layer of the thin film transistor array panel of the present invention are formed.

In the thin film transistor array panel of the present invention, the data line 701, the first block of the source electrode, the third block of the drain electrode, and the electrode layer 704 are all formed by applying the first tone-mask process to a photoresist layer 201 (FIG. 2) which overlaps on the second metal layer 103, to pattern the photoresist layer 201. Then the following processing is performed: to etch the second metal layer 103 and the first metal layer 102 respectively by using a second metal etching solution and a first metal etching solution. The photoresist layer 201 is formed by disposing a photoresist material on the second metal layer 103. A mask to which the first tone-mask process corresponds is a half tone mask.

The second block 702 of the source electrode and the fourth block 703 of the drain electrode are both formed by performing a gray process to the photoresist layer 201 which has been processed by the first tone-mask process, then etching the second metal layer 103 by using the second metal etching solution and removing the photoresist layer 201 which is disposed on the second metal layer 103.

In the thin film transistor array panel of the present invention, the semiconductor layer 801 is formed by disposing a semiconductor material on at least one portion of the source electrode, at least one portion of the drain electrode, and the gap, then applying a second tone-mask process to the semiconductor material. Practically, the semiconductor material is disposed on the at least one portion of the source electrode, the at least one portion of the drain electrode, and the gap by any one of spin-coating, slot-die, and ink-jet printing.

In the thin film transistor array panel of the present invention, the gate electrode 1001 and the scanning line 1401 both are formed by disposing a third metal layer on the insulation layer 901, then applying a third tone-mask process to the third metal layer. The third metal to which the third metal layer corresponds can be Al, Cu, Mo, and Ti.

The protection layer 1101 is formed on the insulation layer 901, the scanning line 1401, and the gate 1001 by any one of spin-coating, slot-die, and ink jet printing.

A portion of the first metal layer 102 on which an organic lighting material layer 1201 and a fourth metal layer (positive electrode layer) 1301 are formed is obtained by first applying a fourth tone-mask process to the protection layer 1101 and/or the insulation layer 901, and then removing a portion of the protection layer and/or the insulation layer to which the electrode layer 704 of the thin film transistor array panel corresponds. Thus, the portion of the first metal layer 102 to which the electrode layer 704 corresponds is exposed. The exposed portion of the first metal layer 102 to which the electrode layer 704 corresponds is then used to carry the organic lighting material layer 1201 and the fourth metal layer (positive electrode layer) 1301.

Figure 15:
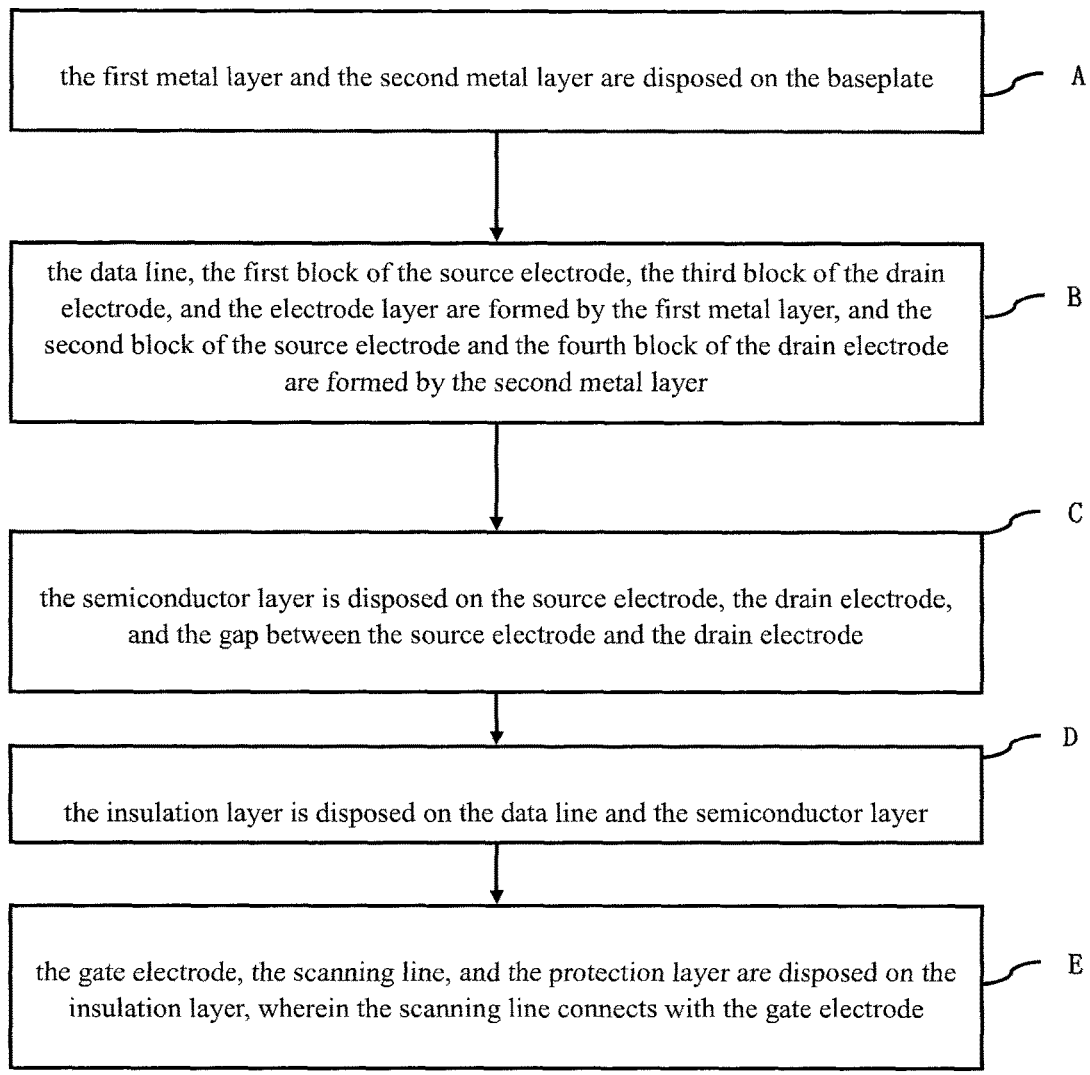
FIG. 15 is a flow diagram of a method in manufacturing the thin film transistor array panel of the present invention.

Referring to FIG. 15, the thin film transistor array panel manufacturing method of the present invention comprises the following steps (also referring to FIGS. 1-6):

A. the first metal layer 102 and the second metal layer 103 are disposed on the baseplate 101. Practically, two layers of metals (the first metal layer 102 and the second metal layer) are disposed on the baseplate 101. The first metal to which the first metal layer 102 corresponds can be Al, Cu, Mo, and Ti. The second metal to which second metal layer 103 corresponds can be ITO (indium tin oxide).

B. the data line 701, the first block of the source electrode, the third block of the drain electrode, and the electrode layer 704 are formed by the first metal layer 102, and the second block 702 of the source electrode and the fourth block 703 of the drain electrode are formed by the second metal layer 103, wherein the second block 702 and the first block overlap to combine integrally to obtain the source electrode, and the fourth block 703 and the third block overlap to combine integrally to obtain the drain electrode. The source electrode connects with the data line 701, and the drain electrode connects with the electrode layer 704.

C. the semiconductor layer 801 is disposed on the source electrode, the drain electrode, and the gap between the source electrode and the drain electrode. The semiconductor layer 801 can be an organic semiconductor.

D. the insulation layer 901 is disposed on the data line 701 and the semiconductor layer 801. The insulation layer 901 can be an organic insulation layer.

E. the gate electrode 1001, the scanning line 1401, and the protection layer 1101 are disposed on the insulation layer 901, wherein the scanning line 1401 connects with the gate electrode 1001.

In manufacturing method of the thin film transistor array panel of the present invention, after the step A and before the step B, the method further comprises:

F. a photoresist material is overlapped on the second metal layer 103, to form the photoresist layer 201.

Figure 16:
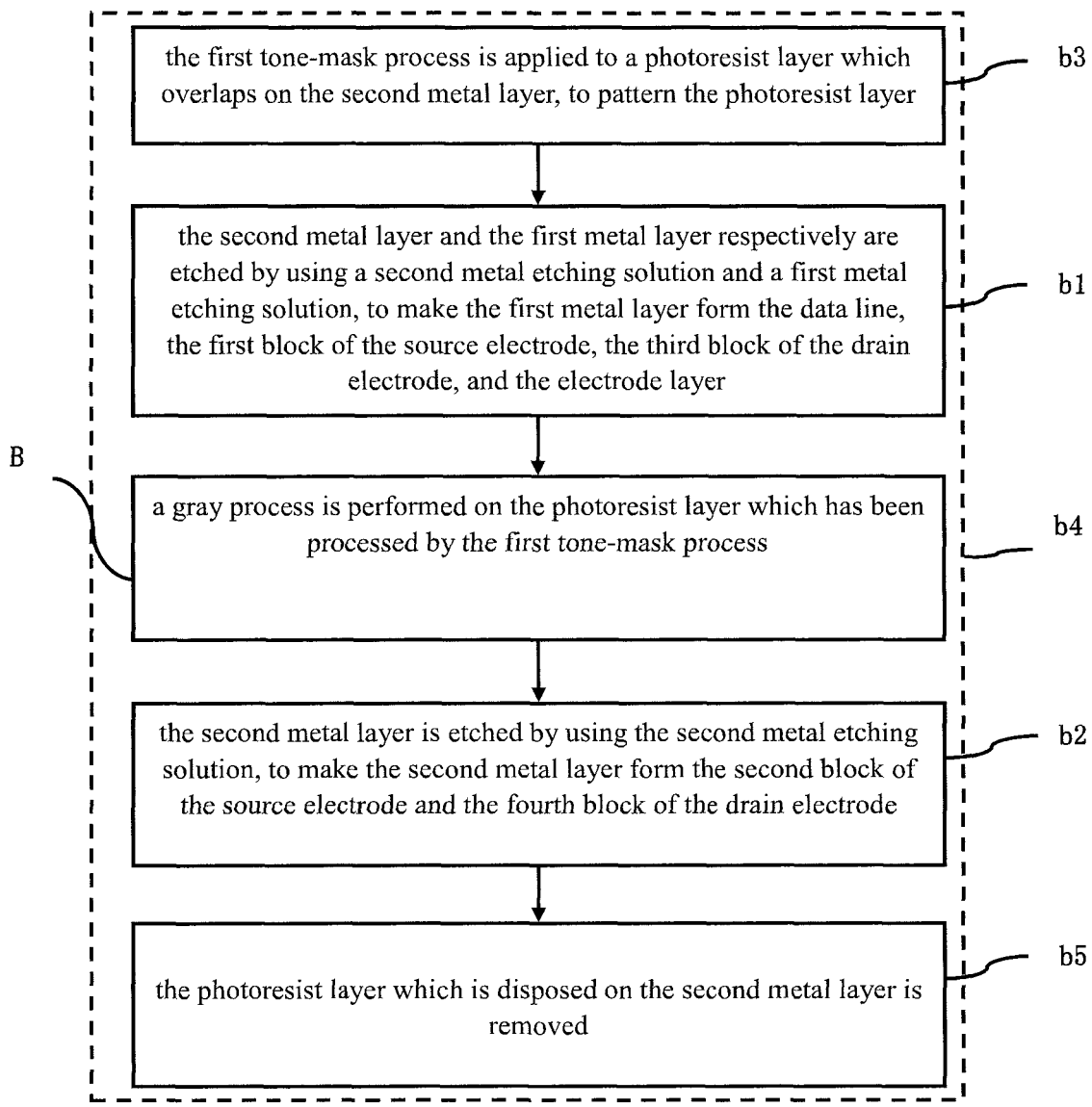
FIG. 16 is a flow diagram of steps of the method of FIG. 15 in forming the data line, the source electrode, the drain electrode, and the electrode layer of the thin film transistor array panel of the present invention.

Referring to FIG. 16, in manufacturing method of the thin film transistor array panel of the present invention, the step B comprises:

b1. a first tone-mask process and a first etching process are applied to the first metal layer 102 and the second metal layer 103, to make the first metal layer 102 form the data line 701, the first block of the source electrode, the third block of the drain electrode, and the electrode layer 704.

b2. a second etching process is applied to the second metal layer 103 which has been processed by the first tone-mask process and the first etching process, to make the second metal layer 103 form the second block 702 of the source electrode and the fourth block 704 of the drain electrode.

In manufacturing method of the thin film transistor array panel of the present invention, before the step b1, the step B further comprises:

b3. the first tone-mask process is applied to the photoresist layer 201 which overlaps on the second metal layer 103, to pattern the photoresist layer 201. Practically, a half tone mask is disposed on the photoresist layer on the second metal layer 103, to perform a pattern process.

The step b1 is:

The second metal layer 103 and the first metal layer 102 respectively are etched by using a second metal etching solution and a first metal etching solution, to make the first metal layer 102 form the data line 701, the first block of the source electrode, the third block of the drain electrode, and the electrode layer 704.

After the step b1 and before the step b2, the step B further comprises:

b4. a gray process is performed on the photoresist layer 201 which has been processed by the first tone-mask process.

The step b2 is:

The second metal layer 103 is etched by using the second metal etching solution, to make the second metal layer 103 form the second block 702 of the source electrode and the fourth block 703 of the drain electrode.

After the step b2, the step B further comprises:

b5. the photoresist layer 201 which is disposed on the second metal layer 103 is removed.

Figure 17:
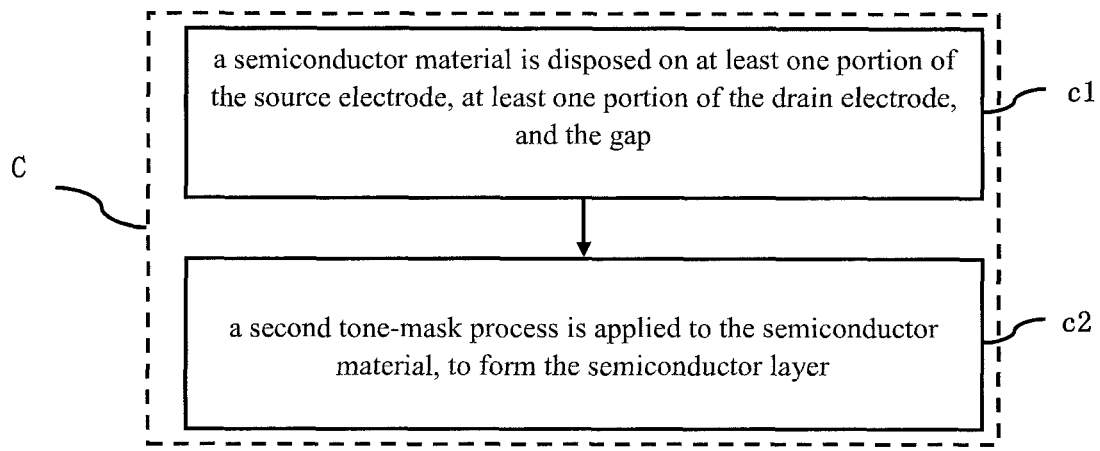
FIG. 17 is a flow diagram of steps of the method of FIG. 15 in forming the semiconductor layer of the thin film transistor array panel of the present invention.

Referring to FIG. 17, in manufacturing method of the thin film transistor array panel of the present invention, the step C further comprises:

c1. a semiconductor material is disposed (coated) on at least one portion of the source electrode, at least one portion of the drain electrode, and the gap. Practically, the semiconductor material is disposed on the at least one portion of the source electrode, the at least one portion of the drain electrode, and the gap by any one of spin-coating, slot-die, and ink-jet printing.

c2. a second tone-mask process is applied to the semiconductor material, to form the semiconductor layer 801.

Figure 18:
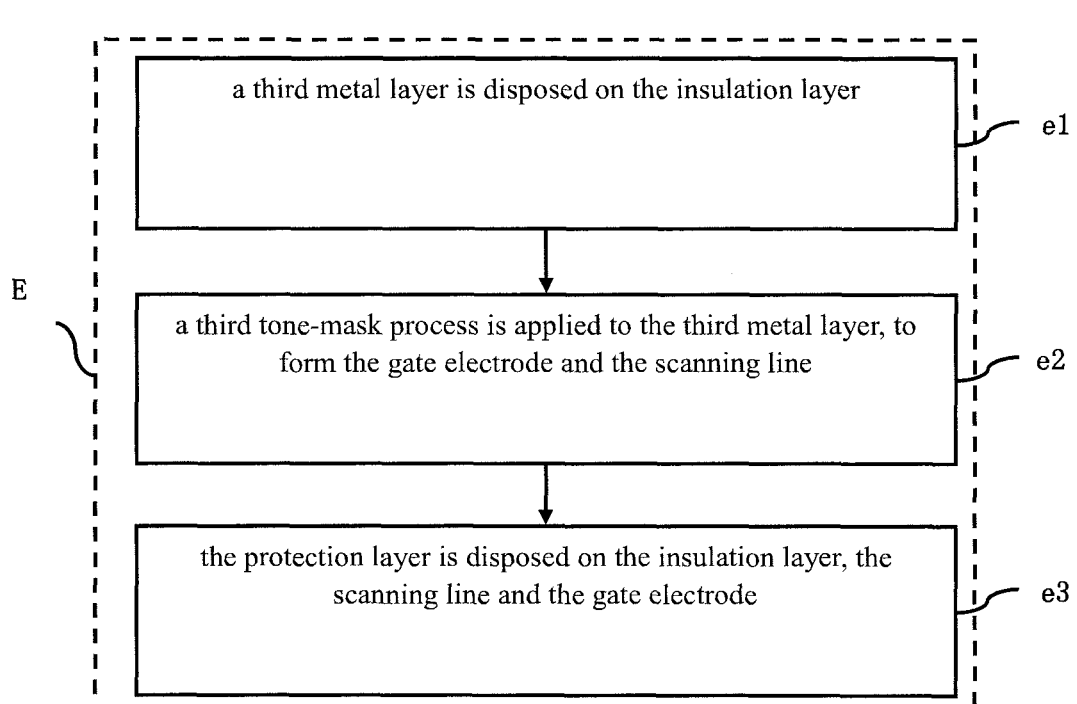
FIG. 18 is a flow diagram of steps of the method of FIG. 15 in forming the scanning line, the gate electrode, and the protection layer of the thin film transistor array panel of the present invention.

Referring to FIG. 18, in manufacturing method of the thin film transistor array panel of the present invention, the step E comprises:

e1. a third metal layer is disposed on the insulation layer 901. The third metal to which the third metal layer corresponds can be Al, Cu, Mo, and Ti.

e2. a third tone-mask process is applied to the third metal layer, to form the gate electrode 1001 and the scanning line 1401.

e3. the protection layer 1101 is disposed on the insulation layer 901, the scanning line 1401 and the gate electrode 1001.

In manufacturing method of the thin film transistor array panel of the present invention, the method further comprises the following steps after the step E:

A fourth tone-mask process is applied to the protection layer 1101 and/or the insulation layer 901, a portion of the protection layer 1101 and/or the insulation layer 901 to which the electrode layer 704 of the thin film transistor array panel corresponds is removed, to expose the portion of the first metal layer 102 to which the electrode layer 704 corresponds.

An organic lighting material layer 1201 is evaporated on the portion of the first metal layer 102 to which the electrode layer 704 corresponds, and a fourth metal layer (positive electrode layer) 1301 is formed on the organic lighting material layer 1201.

The technical proposal is able to decrease the electrical resistance of each of the source electrode and the drain electrode, for the source electrode and the drain electrode are applied with double-layer-metal structures; in other words, the technical problem of the high electrical resistance of each of the source electrode and the drain electrode, caused by taking ITO as the materials of the source electrode and the drain electrode, is solved.

Although one or more embodiment was described in this article, a person skilled in the relevant filed may derive some equivalent variants and modifications based on reading and understanding the specification and drawings. This article should comprise all kinds of equivalent variants and modifications. Especially to the functions executed by the above components (such as elements or resources), it is described to execute the mentioned function. In addition, although a particular feature of the present specification has a number of implementations with respect to only one is opened, but this feature can be used with as can be given or particular application is a desirable and advantageous implementations of one or more other combinations of features. Moreover, the terms "include", "with", or "have" or its variants, where used in a specification or claim, are designed to have a similar meaning to "comprise".

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A thin film transistor array panel, comprising:
a baseplate;
a data line, being formed by a first metal layer, wherein the first metal layer is disposed on the baseplate;
a thin film transistors, the thin film transistor comprising:
a source electrode, comprising a first block and a second block, the first block and the second block overlapping to combine integrally, the first block being a portion of the first metal layer located in a first region, the second block being a portion of a second metal layer located in the first region, wherein the first region is a portion to which the source electrode corresponds, the second metal layer disposed on the first metal layer, the source electrode connects with the data line;
a drain electrode, comprising a third block and a fourth block, the third block and the fourth block overlapping to combine integrally, the third block being a portion of the first metal layer located in a second region, the fourth block being a portion of a second metal layer located in the second region, wherein the second region is a portion to which the drain electrode corresponds, the second metal layer disposed on the first metal layer;
a semiconductor layer, being overlapping on the source electrode, the drain electrode, and a gap between the source electrode and the drain electrode;
a gate electrode, being over the semiconductor;
an insulation layer, being overlapping on the data line and the semiconductor layer;
a scanning line, being disposed on the insulation layer, the scanning line connecting with the gate electrode;
a protection layer, being disposed on the scanning line and the insulation layer;
an electrode layer, being formed by the first metal layer, the electrode layer connecting with the drain electrode;
wherein the gate electrode is disposed on the insulation layer.

2. The thin film transistor array panel according to claim 1, wherein the semiconductor layer is an organic semiconductor layer.

3. The thin film transistor array panel according to claim 1, wherein a portion of the first metal layer to which the electrode layer corresponds is configured to carry an organic lighting material layer and a positive electrode layer.

* * * * *